(12) United States Patent
Wang

(10) Patent No.: US 11,204,530 B2
(45) Date of Patent: Dec. 21, 2021

(54) ARRAY SUBSTRATE AND DISPLAY DEVICE

(71) Applicant: Wuhan China Star Optoelectronics Technology Co., Ltd., Wuhan (CN)

(72) Inventor: Chuan Wang, Wuhan (CN)

(73) Assignee: Wuhan China Star Optoelectronics Technology Co., Ltd., Wuhan (CN)

( * ) Notice: Subject to any disclaimer, the term of this patent is extended or adjusted under 35 U.S.C. 154(b) by 131 days.

(21) Appl. No.: 16/630,507

(22) PCT Filed: Nov. 29, 2018

(86) PCT No.: PCT/CN2018/118065
§ 371 (c)(1),
(2) Date: Jan. 13, 2020

(87) PCT Pub. No.: WO2020/062537
PCT Pub. Date: Apr. 2, 2020

(65) Prior Publication Data
US 2020/0174325 A1    Jun. 4, 2020

(30) Foreign Application Priority Data

Sep. 29, 2018    (CN) .......................... 201811150034.3

(51) Int. Cl.
| | |
|---|---|
| *G02F 1/1362* | (2006.01) |
| *H01L 23/60* | (2006.01) |
| *H01L 27/02* | (2006.01) |
| *H01L 27/12* | (2006.01) |

(52) U.S. Cl.
CPC .. *G02F 1/136204* (2013.01); *G02F 1/136286* (2013.01); *H01L 23/60* (2013.01); *H01L 27/0292* (2013.01); *H01L 27/124* (2013.01); *H01L 27/1218* (2013.01)

(58) Field of Classification Search
CPC .................................................. G02F 1/136204
See application file for complete search history.

(56) References Cited

U.S. PATENT DOCUMENTS

| | | | |
|---|---|---|---|
| 2008/0246707 A1* | 10/2008 | Sato .................... | G02F 1/13454 345/84 |
| 2009/0021659 A1 | 1/2009 | Tanaka | |
| 2009/0310052 A1* | 12/2009 | Huang ................ | G02F 1/13452 349/40 |

(Continued)

FOREIGN PATENT DOCUMENTS

| | | |
|---|---|---|
| CN | 1902539 | 1/2007 |
| CN | 104765490 | 7/2015 |

(Continued)

*Primary Examiner* — Benjamin P Sandvik

(57) ABSTRACT

An array substrate and a display device are provided. An antistatic conductive wire is disposed in the non-display region, and the antistatic conductive wire comprises at least two antistatic conductive layers. An antistatic conductive layer is firstly formed in the fabrication processes, and the antistatic conductive layer has a function of antistatic to prevent static electricity from generating in the processes. After other antistatic conductive layers are formed, a capacitor structure is formed between antistatic conductive layers. Meanwhile, the static discharge is more easily performed in the opposite direction of the antistatic conductive multi-layer.

18 Claims, 5 Drawing Sheets

(56) References Cited

U.S. PATENT DOCUMENTS

| | | | | |
|---|---|---|---|---|
| 2015/0241746 | A1* | 8/2015 | Hashiguchi | G02F 1/134363 |
| | | | | 349/139 |
| 2016/0197274 | A1* | 7/2016 | Li | H01L 27/127 |
| | | | | 257/29 |
| 2016/0283027 | A1 | 9/2016 | Hao et al. | |
| 2018/0040607 | A1* | 2/2018 | Xiong | H01L 27/0288 |
| 2018/0108683 | A1* | 4/2018 | Jeon | H01L 27/1244 |

FOREIGN PATENT DOCUMENTS

| | | |
|---|---|---|
| CN | 107219699 | 9/2017 |
| CN | 107422561 | 12/2017 |
| CN | 208861125 | 5/2019 |

\* cited by examiner

ARRAY SUBSTRATE AND DISPLAY DEVICE

RELATED APPLICATIONS

This application is a National Phase of PCT Patent Application No. PCT/CN2018/118065 having International filing date of Nov. 29, 2018, which claims the benefit of priority of Chinese Patent Application No. 201811150034.3 filed on Sep. 29, 2018. The contents of the above applications are all incorporated by reference as if fully set forth herein in their entirety.

FIELD AND BACKGROUND OF THE INVENTION

The present invention relates to a field of liquid crystal displays, and particularly to an array substrate and a display device.

Array substrates have been widely used in high-end smart phones and tablet computers. The array substrates include many multilayered electronic components of stacked metal layers and non-metal layers, such as thin film transistors. Thin film transistors are precise electronic elements which are constantly exposed to static electricity during manufacturing and operation. If static electricity is released at the thin film transistors, it may cause transistor failure or electrical abnormalities.

Accordingly, enhancing antistaticity of the array substrates is significant for improving the yield of the array substrates and extending lifespans of the devices.

SUMMARY OF THE INVENTION

According to one embodiment of the present invention, an array substrate and a display device are provided to enhance antistatic capability of an array substrate.

In order to solve the above-mentioned problems, the present invention provides embodiments described as follows.

In one embodiment according to the present invention, an array substrate comprises a substrate body, and the substrate body comprises a display region and a non-display region positioned around the display region, and an antistatic conductive wire disposed in the non-display region, and the antistatic conductive wire comprises at least two antistatic conductive layers configured to prevent static electricity.

In one embodiment according to the present invention, the antistatic conductive wire comprises a first antistatic conductive layer and a second antistatic conductive layer, the first antistatic conductive layer is disposed in a buffer insulating layer, and the second antistatic conductive layer is disposed in a protective insulating layer.

In one embodiment according to the present invention, the first antistatic conductive layer is a first doped germanium layer, and the first antistatic conductive layer and a second doped germanium layer disposed in the display region are disposed on a same layer.

In one embodiment according to the present invention, the first antistatic conductive layer is a metal layer, and the first antistatic conductive layer and a gate layer disposed in the display region are disposed on a same layer.

In one embodiment according to the present invention, the first antistatic conductive layer is a metal layer, and the first antistatic conductive layer and a source/drain layer disposed in the display region are disposed on a same layer.

In one embodiment according to the present invention, the at least two the antistatic conductive layers overlap with projections on a surface of the substrate body along a predetermined direction.

In one embodiment according to the present invention, the at least two antistatic conductive layers are continuous and disposed around the display region.

In one embodiment according to the present invention, a surface of at least one antistatic conductive layer of the antistatic conductive wire is provided with at least one protrusion, and the protrusion faces other antistatic conductive layers of the antistatic conductive line.

In one embodiment according to the present invention, at least one via hole defined between two adjacent antistatic conductive layers of the antistatic conductive line, wherein the two adjacent antistatic conductive layers are electrically connected to each other through a conductive material within the via hole.

In one embodiment according to the present invention, the antistatic conductive layers disposed on a same layer comprise a plurality of sub-antistatic conductive wires, and the sub-antistatic conductive wires are insulated from each other.

According to another embodiment of the present invention, a display device is provided, and the display device comprises an array substrate, and the substrate body comprises a substrate body, and the substrate body comprises a display region and a non-display region positioned around the display region, and an antistatic conductive wire disposed in the non-display region, and the antistatic conductive wire comprises at least two antistatic conductive layers configured to prevent static electricity.

In one embodiment according to the present invention, the antistatic conductive wire comprises a first antistatic conductive layer and a second antistatic conductive layer, the first antistatic conductive layer is disposed in a buffer insulating layer, and the second antistatic conductive layer is disposed in a protective insulating layer.

In one embodiment according to the present invention, the first antistatic conductive layer is a first doped germanium layer, and the first antistatic conductive layer and a second doped germanium layer disposed in the display region are disposed on a same layer.

In one embodiment according to the present invention, the first antistatic conductive layer is a metal layer, and the first antistatic conductive layer and a gate layer disposed in the display region are disposed on a same layer.

In one embodiment according to the present invention, the first antistatic conductive layer is a metal layer, and the first antistatic conductive layer and a source/drain layer disposed in the display region are disposed on a same layer.

In one embodiment according to the present invention, the at least two antistatic conductive layers overlap with projections on a surface of the substrate body along a predetermined direction.

In one embodiment according to the present invention, the at least two antistatic conductive layers are continuous and disposed around the display region.

In one embodiment according to the present invention, a surface of at least one antistatic conductive layer of the antistatic conductive wire is provided with at least one protrusion, and the protrusion faces other antistatic conductive layers of the antistatic conductive line.

In one embodiment according to the present invention, at least one via hole is defined between two adjacent antistatic conductive layers of the antistatic conductive line, wherein the two adjacent antistatic conductive layers are electrically connected to each other through a conductive material within the via hole.

In one embodiment according to the present invention, the antistatic conductive layers disposed on a same layer comprise a plurality of sub-antistatic conductive wires, and the sub-antistatic conductive wires are insulated from each other.

The present invention has beneficial effects are described as follows. One embodiment according to the present invention provides a new array substrate and a display device, which comprise a substrate body, and the substrate body comprises a display region and a non-display region disposed around the display region. An antistatic conductive wire is disposed in the non-display region, and the antistatic conductive wire comprises at least two antistatic conductive layers. An antistatic conductive layer is firstly formed in the fabrication processes, and the antistatic conductive layer has a function of antistatic to prevent static electricity generated in the processes. After the other antistatic conductive layers are formed, a capacitor structure is formed between antistatic conductive layers. An electric charge generated by the external static electricity is easier to accumulate on the capacitor structure (i.e. the antistatic conductive wire). Meanwhile, the static discharge is more easily performed in the opposite direction of the antistatic conductive multilayer, and the static electricity transferred to internal of the array substrate which causes the device to fail can be avoided. Therefore, antistatic capability of the array substrate is enhanced, the yield of the array substrate is improved, and the device life is extended.

BRIEF DESCRIPTION OF THE SEVERAL VIEWS OF THE DRAWINGS

In order to more clearly illustrate embodiments or technical solutions in the present invention, the drawings used in the description of the embodiments or current technology will be briefly described below. Obviously, the drawings in the following description are merely some embodiments of the present invention. A person skilled in the art may also obtain other drawings without any creative efforts.

DESCRIPTION OF SPECIFIC EMBODIMENTS OF THE INVENTION

Figure 1:
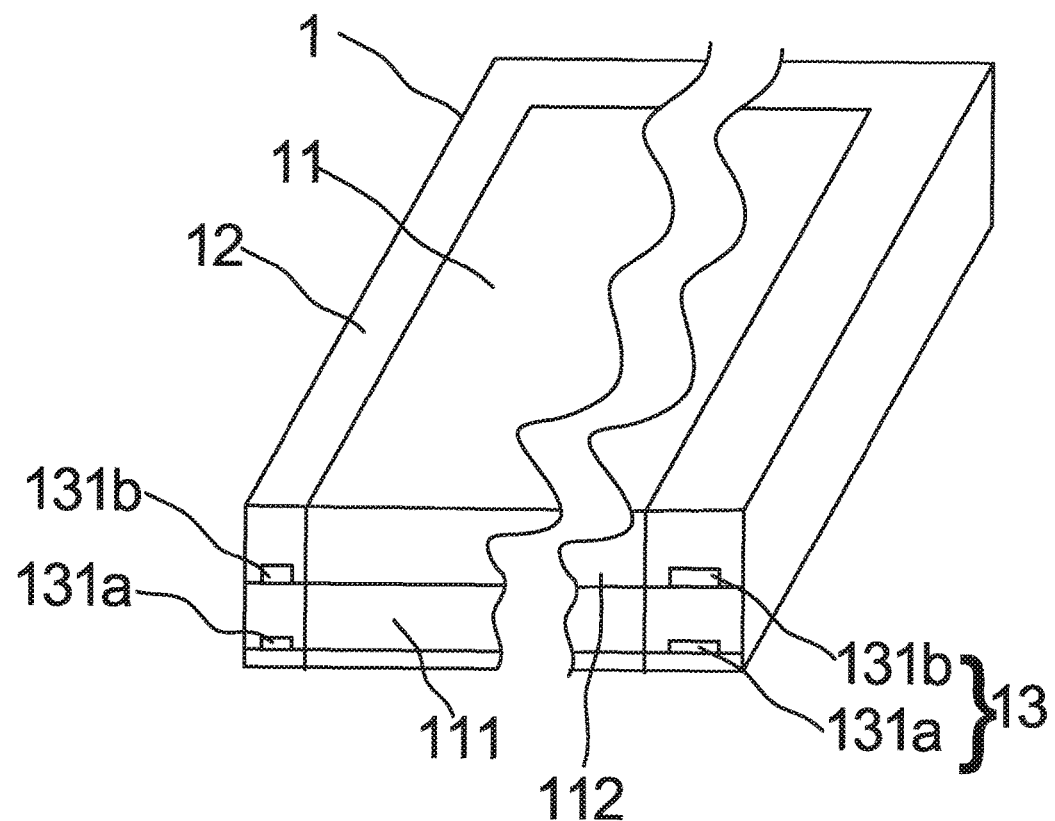
FIG. 1 is a first schematic diagram of an array substrate according to an embodiment of the present application.

The following description of the embodiments is provided by reference to the following drawings. Directional terms mentioned in this application, such as "up," "down," "forward," "backward," "left," "right," "inside," "outside," "side," etc., are merely indicated the direction of the drawings. Therefore, the directional terms are used for illustrating and understanding of the application rather than limiting thereof. In the figures, elements with similar structure are indicated by the same reference numerals.

As shown in FIG. 1, in order to enhance antistatic capability of an array substrate, the array substrate according to the present application comprises a substrate body 1. The substrate body 1 comprises a display region 11 and a non-display region 12 positioned around the display region 11. An antistatic conductive wire 13 is disposed in the non-display region 12. The antistatic conductive wire 13 comprises at least two antistatic conductive layers 131 (first antistatic conductive layer 131a and second antistatic conductive layer 131b shown in FIG. 1) configured to prevent static electricity.

In one embodiment, an antistatic conductive layer is firstly formed in a process, and the antistatic conductive layer has an antistatic function to prevent static electricity from generating in the process. After other antistatic conductive layers are formed, a capacitor structure is formed between antistatic conductive layers. An electric charge generated by the external static electricity tends to accumulate on the capacitor structure (i.e. the antistatic conductive wire). Meanwhile, it is more likely that an electrostatic discharge occurs in the opposite direction of the multilayered antistatic conductive layers to prevent static electricity from transferring to the internal array substrate which causes failure of the device. Therefore, antistatic capability of the array substrate is enhanced, the yield of the array substrate is improved, and the device life is extended.

As shown in FIG. 1, in one embodiment, an antistatic conductive wire comprises a first antistatic conductive layer 131a and a second antistatic conductive layer 131b, the first antistatic conductive layer 131a is disposed in a buffer insulating layer 111 which corresponds to a buffer layer and an insulating layer disposed between metal layers in the display region, and the second antistatic conductive layer 131b is disposed in a protective insulating layer 112 which corresponds to the insulating layer and a planar layer disposed on the metal layer in the display region.

In one embodiment, the first antistatic conductive layer 131a is a first doped germanium layer, and the first antistatic conductive layer 131a and a second doped germanium layer disposed in the display region are disposed in the same layer. Accordingly, the fabrication processes can be simplified.

In one embodiment, the first antistatic conductive layer 131a is a metal layer, and the first antistatic conductive layer 131a and a gate layer are disposed in the same layer. Accordingly, the fabrication processes can be simplified.

In one embodiment, the first antistatic conductive layer 131a is a metal layer, and the first antistatic conductive layer 131a and a source/drain layer are disposed in the same layer. Accordingly, the fabrication processes can be simplified.

In one embodiment, at least two antistatic conductive layers overlap with projections on a surface of the substrate body along a predetermined direction.

Figure 2:
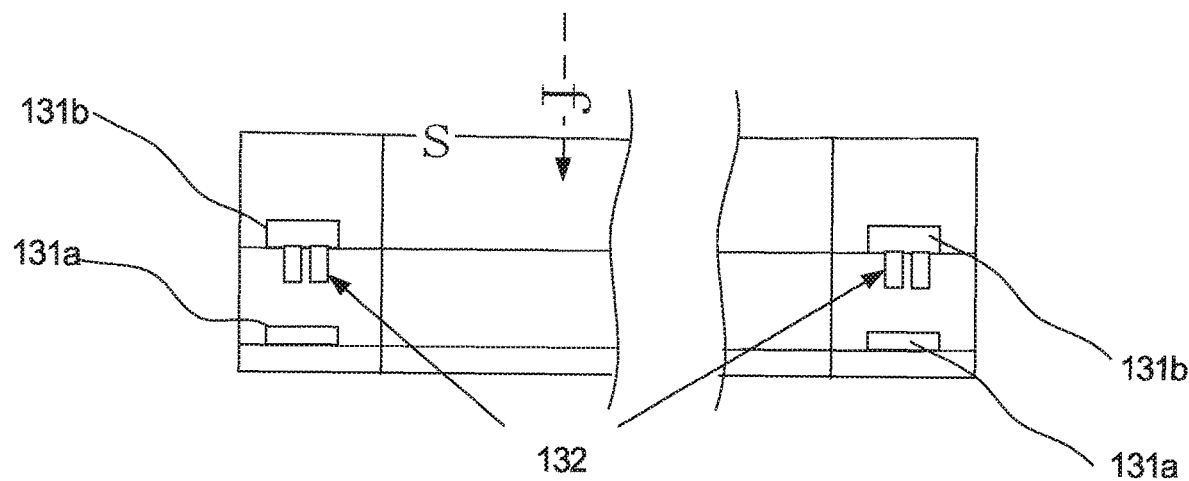
FIG. 2 is a first cross-sectional view of the array substrate according to the embodiment of the present application.

In one embodiment, the predetermined direction can be any direction that is that is not parallel to the surface of the substrate body marked with "S" as shown in FIG. 2. Referring to FIG. 2, in order to enhance the antistatic capability of the array substrate, the predetermined direction is to the substrate body surface marked with "S".

In one embodiment according to the present invention, overlapped projection means that a projection of the first antistatic conductive layer 131a overlaps with a projection of the second antistatic conductive layer 131b, or the projection of the first antistatic conductive layer 131a covers the projection of the second antistatic conductive layer 131b, or the second antistatic conductive layer 131b covers the projection of the first antistatic conductive layer 131a.

In one embodiment, the projection of the first antistatic conductive layer 131a completely overlaps with the projection of the second antistatic conductive layer 131b.

In one embodiment, the projection of the first antistatic conductive layer 131a completely covers the projection of the second antistatic conductive layer 131b.

In one embodiment, the projection of the second antistatic conductive layer 131b completely covers the projection of the first antistatic conductive layer 131a.

In one embodiment, the overlapped projection between the projection of the first antistatic conductive layer 131a and the projection of the second antistatic conductive layer 131b can be different at different positions, so that a layout of the metal lines in different regions can be balanced.

In one embodiment, a surface of at least one antistatic conductive layer of the antistatic conductive wire is provided with at least a protrusion, and the protrusion faces other antistatic conductive layers of the antistatic conductive wire.

As shown in FIG. 2, in one embodiment, a surface of the second antistatic conductive layer 131b is provided with a protrusion facing the first antistatic conductive layer 131a. Based on a principle of point discharge, static electricity is arbitrarily released in the direction between two antistatic conductive layers.

In one embodiment, protrusions 132 refers to a plurality of projections, and are nanometer in size.

In one embodiment, a surface of one of the protrusions 132 has a continuous curved surface.

In one embodiment, the plurality of protrusions 132 are spaced at intervals on the surface of the antistatic conductive layer.

In one embodiment, one of the protrusions 132 is a composite structure of one or more cone, semi ellipsoid, and circular truncated cone.

In one embodiment, one of the protrusions 132 has a diameter of 50 nm to 400 nm.

In one embodiment, height of the at least one protrusion 132 is 100 nm to 400 nm.

In one embodiment, a distance between an edge of adjacent protrusions 132 and substrate body marked with "S" is from 50 nm to 500 nm.

In one embodiment, the at least one protrusion 132 can be in a strip shape so as to increase an area of point discharge.

In one embodiment, at least one via hole is defined between two adjacent antistatic conductive layers of the antistatic conductive wire, and the two adjacent antistatic conductive layers are electrically connected to each other through a conductive material within the via hole.

Figure 3:
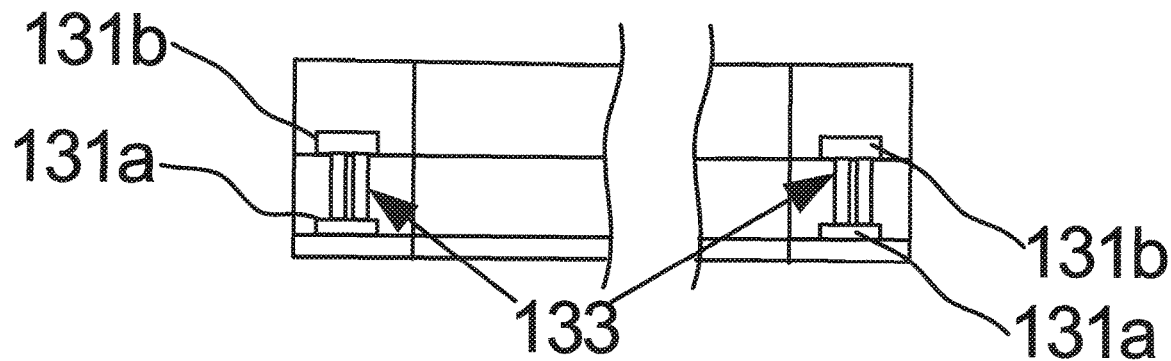
FIG. 3 is a second cross-sectional view of the array substrate according to the embodiment of the present application.

As shown in FIG. 3, in one embodiment, at least one via hole 133 is defined between the first antistatic conductive layer 131a and the second antistatic conductive layer 131b, and the at least one via hole 133 is filled with a conductive material so that the first antistatic conductive layer 131a is electrically connected the second antistatic conductive layer 131b.

In one embodiment, at least one of the protrusions 132 and at least one via hole 133 are formed in a staggered manner In one embodiment, shapes and/or density of protrusions 132 and of via holes 133 can be different in different regions.

In one embodiment, the antistatic conductive layers disposed on a same layer comprise a plurality of sub-antistatic conductive wires, and the sub-antistatic conductive wires are insulated from each other, so that static electricity transferred to internal of the array substrate can be avoided.

Figure 4:
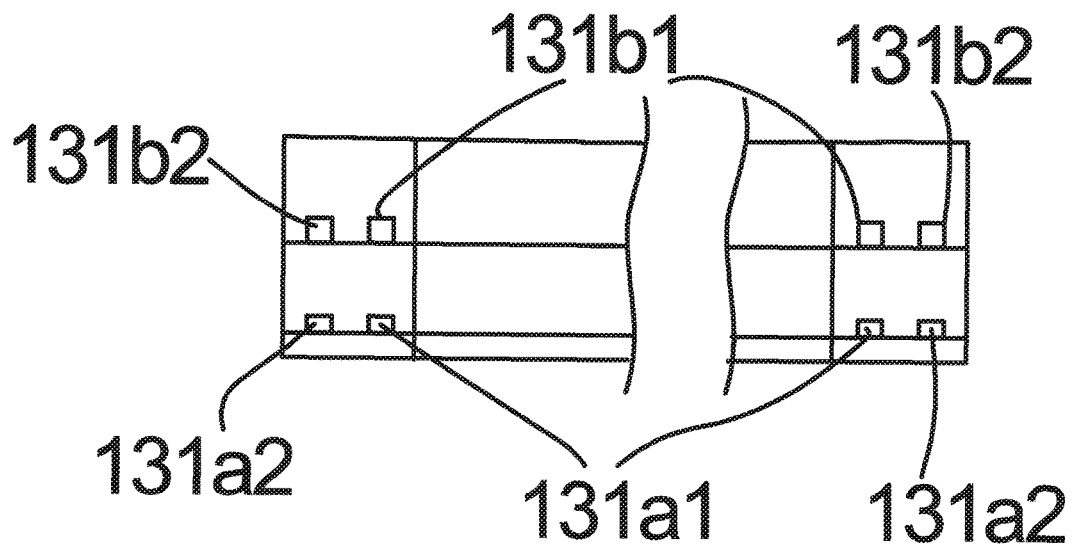
FIG. 4 is a third cross-sectional view of the array substrate according to the embodiment of the present application.

As shown in FIG. 4, in one embodiment, the first antistatic conductive layer 131a comprises two sub-antistatic conductive wires, that is, a sub-antistatic conductive wire 131a1 and a sub-antistatic conductive wire 131a2. The second antistatic conductive layer 131b comprises two sub-antistatic conductive wires, that is, a sub-antistatic conductive wire 131b1 and a sub-antistatic conductive wire 131b2.

In one embodiment, at least two antistatic conductive layers are continuous and disposed around the display region, so that the static electricity transferred to internal of the array substrate can be completely avoided.

According to different layouts, a method for setting the at least two antistatic conductive layers comprise full-round and half-round of the display region.

Figure 5:
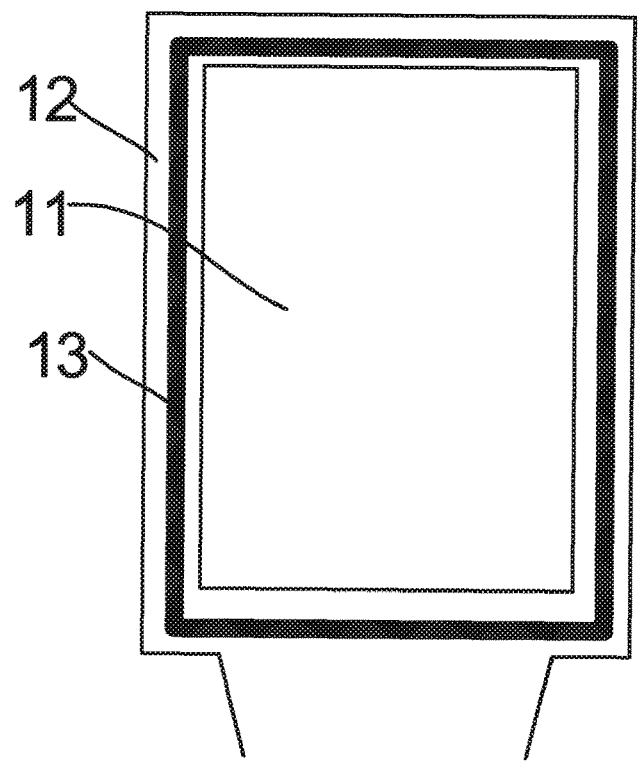
FIG. 5 is a fourth cross-sectional view of the array substrate according to the embodiment of the present application.

As shown in FIG. 5, in one embodiment, the at least two antistatic conductive layers are disposed continuously and fully around the display region.

Figure 6:
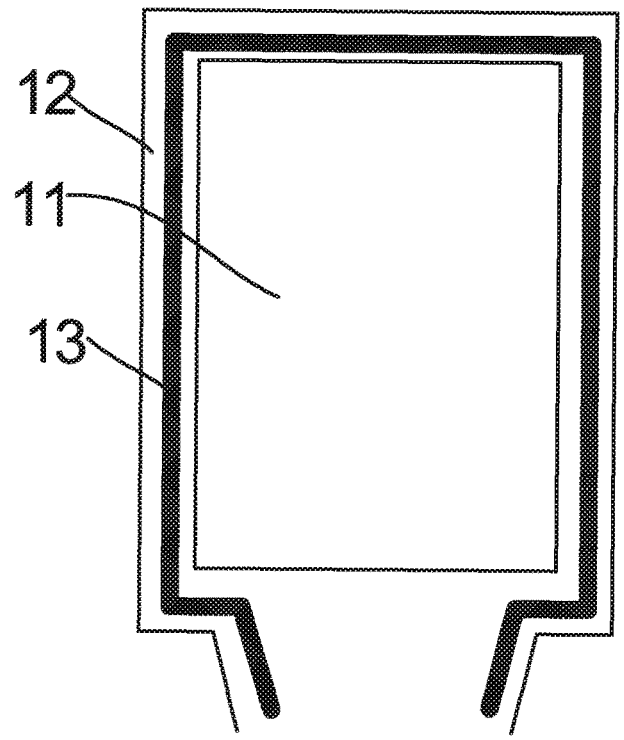
FIG. 6 is a fifth cross-sectional view of the array substrate according to the embodiment of the present application.

As shown in FIG. 6, in one embodiment, the at least two antistatic conductive layers are disposed continuously and around half of the display region.

Figure 7:
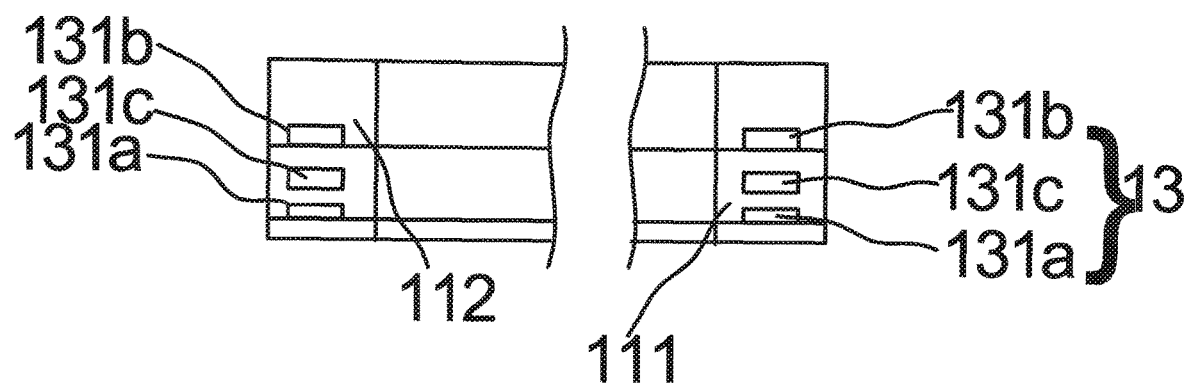
FIG. 7 is a sixth cross-sectional view of the array substrate according to the embodiment of the present application.

As shown in FIG. 7, in one embodiment, the antistatic conductive wire comprises at least three antistatic conductive layers, that is, the first antistatic conductive layer 131a, the second antistatic conductive layer 131b, and the third antistatic conductive layer 131c. The first antistatic conductive layer 131a and the third antistatic conductive layer 131c are disposed on a buffer insulating layer 111 which corresponds to a buffer layer and an insulating layer disposed between metal layers in the display region. The second antistatic conductive layer 131b is disposed in a protective insulating layer 112 which corresponds to the insulating layer and a planar layer disposed on the metal layer in the display region.

Figure 8:
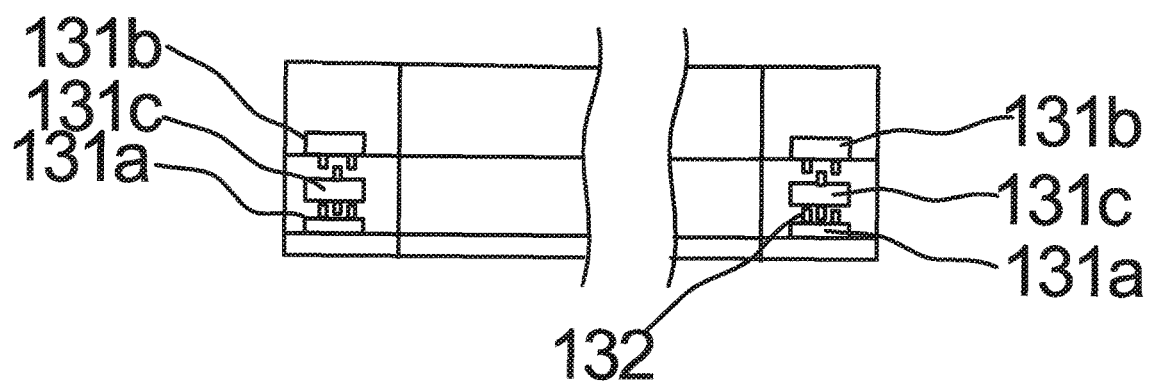
FIG. 8 is a seventh cross-sectional view of the array substrate according to the embodiment of the present application.

As shown in FIG. 8, in one embodiment, protrusions 132 are provided on surfaces of the first antistatic conductive layer 131a, the second antistatic conductive layer 131b, and the third antistatic conductive layer 131c. In another embodiment, protrusions 32 can be provided only on the antistatic conductive layer 131.

Figure 9:
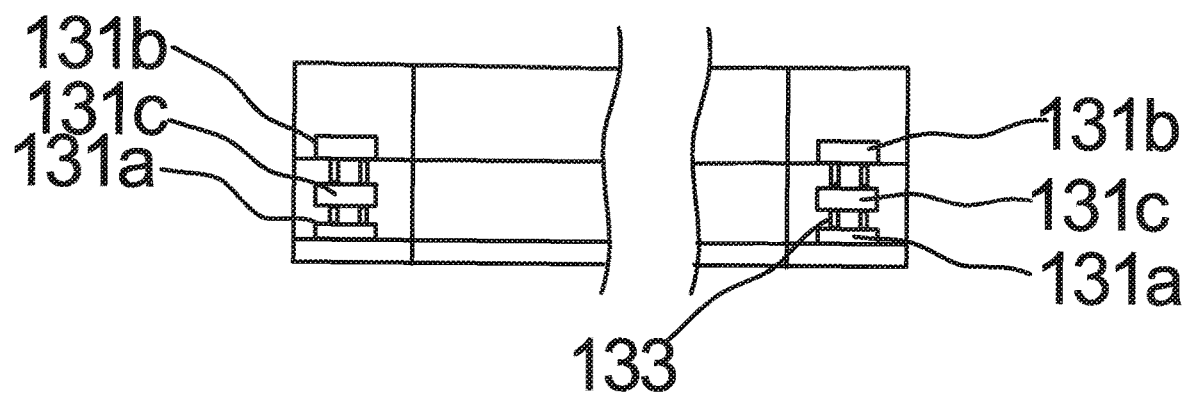
FIG. 9 is an eighth cross-sectional view of the array substrate according to the embodiment of the present application.

As shown in FIG. 9, in one embodiment, at least one via hole 133 is defined between the first antistatic conductive layer 131a and the third antistatic conductive layer 131c. Also, at least one via hole 133 is defined on a surface between the second antistatic conductive layer 131b and the third antistatic conductive layer 131c, and the at least one via hole 133 is filled with a conductive material, so that the antistatic conductive layers are electrically connected to each other. Also, in one embodiment, the at least one vial hole 133 can merely be defined between adjacent antistatic conductive layers.

Figure 10:
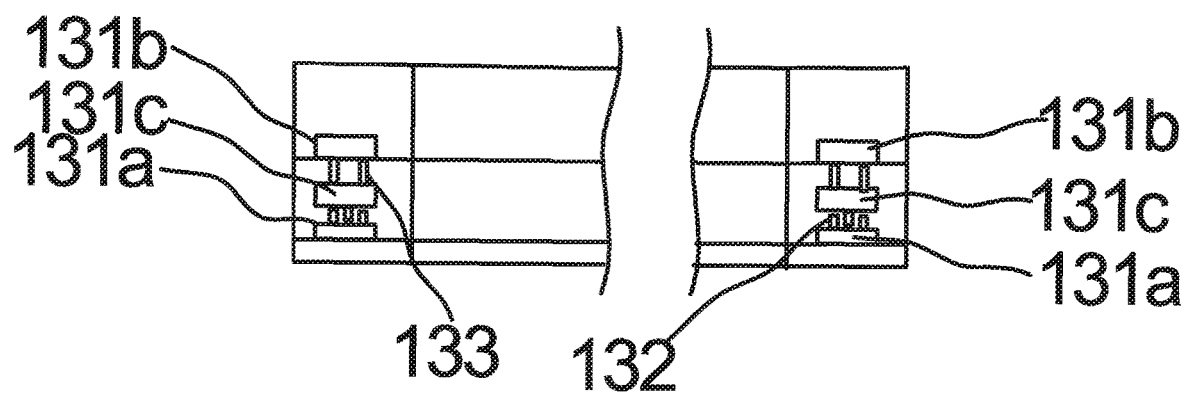
FIG. 10 is a ninth cross-sectional view of the array substrate according to the embodiment of the present application.

As shown in FIG. 10, in one embodiment, at least one protrusion 132 is provided on the first antistatic conductive layer 131a and the third antistatic conductive layer 131c. At least one via hole 133 is defined on a surface between the second antistatic conductive layer 131b and the third antistatic conductive layer 131c, and the at least one via hole 133 is filled with a conductive material, so that the antistatic conductive layers are electrically connected to each other. In another embodiment, the at least one protrusion 132 and the at least one via hole 133 can be disposed in any combination.

In one embodiment, the antistatic conductive wire comprises at least three antistatic conductive layers, and these antistatic conductive layers can be disposed on the same or different directions. They can be disposed based on a layout of the metal lines.

In one embodiment, a display device provided according to the present invention comprises an array substrate. The array substrate comprises a substrate body, and the substrate body comprises a display region and a non-display region disposed around the display region. An antistatic conductive wire is disposed in the non-display region, and the antistatic conductive wire comprises at least two antistatic conductive layers for preventing static electricity.

Further, in one embodiment, a display device according to the present invention comprises the above-mentioned array substrate, and the array substrate is applied to a display device such as a smart touch cellphone or a TV. The display device including the array substrate has a stronger antistatic capability, and thus the device life is extended. Accordingly, a performance of the display device is improved.

In one embodiment, the antistatic conductive wire comprises a first antistatic conductive layer and a second antistatic conductive layer, the first antistatic conductive layer is disposed in a buffer insulating layer, and the second antistatic conductive layer is disposed in a protective insulating layer.

In one embodiment, a first antistatic conductive layer is a first doped germanium layer, and the first antistatic conductive layer and a second doped germanium layer disposed in the display region are disposed in the same layer.

In one embodiment, a first antistatic conductive layer is a metal layer, and the first antistatic conductive layer and a gate layer are disposed on a same layer.

In one embodiment, a first antistatic conductive layer is a metal layer, and the first antistatic conductive layer and a source/drain layer disposed in the display region are disposed on a same layer.

In one embodiment, at least two the antistatic conductive layers overlap with projections on a surface of the substrate body along a predetermined direction.

In one embodiment, at least two antistatic conductive layers are continuous and disposed around the display region.

In one embodiment, a surface of at least one antistatic conductive layer of the antistatic conductive wire is provided with at least one protrusion, and the protrusion faces other antistatic conductive layers of the antistatic conductive wire.

In one embodiment, at least one via hole is defined between two adjacent antistatic conductive layers of the antistatic conductive wire, and the two adjacent antistatic conductive layers are electrically connected to each other through a conductive material within the via hole.

In one embodiment, the antistatic conductive layers disposed on a same layer comprise a plurality of sub-antistatic conductive wires, and the sub-antistatic conductive wires are insulated from each other.

According to the abovementioned embodiments, the present invention provides an array substrate and a display device. The array substrate comprises a substrate body, and the substrate body comprises a display region and a non-display region disposed around the display region. An antistatic conductive wire is disposed in the non-display region, and the antistatic conductive wire comprises at least two antistatic conductive layers. An antistatic conductive layer is firstly formed in the fabrication processes, and the antistatic conductive layer has a function of antistatic to prevent static electricity generated in the processes. After the other antistatic conductive layers are formed, a capacitor structure is formed between antistatic conductive layers. An electric charge generated by the external static electricity is easier to accumulate on the capacitor structure (i.e. the antistatic conductive wire). Meanwhile, the static discharge is more easily performed in the opposite direction of the antistatic conductive multi-layer, and the static electricity transferred to internal of the array substrate which causes the device to fail can be avoided. Therefore, antistatic capability of the array substrate is enhanced.

In the above, the present application has been described in the above preferred embodiments, but the preferred embodiments are not intended to limit the scope of the invention, and a person skilled in the art may make various modifications without departing from the spirit and scope of the application. The scope of the present application is determined by claims.

What is claimed is:

1. An array substrate, comprising:
a substrate body, comprising a display region and a non-display region positioned around the display region; and
an antistatic conductive wire disposed in the non-display region;
wherein the antistatic conductive wire comprises at least two antistatic conductive layers configured to prevent static electricity;
wherein a surface of at least one antistatic conductive layer of the antistatic conductive wire is provided with a plurality of protrusions, the plurality of protrusions face other antistatic conductive layers of the antistatic conductive line, the plurality of protrusions are spaced at intervals on the surface of the antistatic conductive layer and are nanometer in size, and a height of the plurality of the protrusions is 100 nm to 400 nm.

2. The array substrate according to claim 1, wherein the antistatic conductive wire comprises a first antistatic conductive layer and a second antistatic conductive layer, the first antistatic conductive layer is disposed in a buffer insulating layer, and the second antistatic conductive layer is disposed in a protective insulating layer.

3. The array substrate according to claim 2, wherein the first antistatic conductive layer is a first doped germanium layer, and the first antistatic conductive layer and a second doped germanium layer disposed in the display region are disposed on a same layer.

4. The array substrate according to claim 2, wherein the first antistatic conductive layer is a metal layer, and the first antistatic conductive layer and a gate layer disposed in the display region are disposed on a same layer.

5. The array substrate according to claim 2, wherein the first antistatic conductive layer is a metal layer, and the first antistatic conductive layer and a source/drain layer disposed in the display region are disposed on a same layer.

6. The array substrate according to claim 1, wherein the at least two the antistatic conductive layers overlap with projections on a surface of the substrate body along a predetermined direction.

7. The array substrate according to claim 1, wherein the at least two antistatic conductive layers are continuous and disposed around the display region.

8. The array substrate according to claim 1, further comprising at least one via hole defined between two adjacent antistatic conductive layers of the antistatic conductive line, wherein the two adjacent antistatic conductive layers are electrically connected to each other through a conductive material within the via hole.

9. The array substrate according to claim 1, wherein the antistatic conductive layers disposed on a same layer comprise a plurality of sub-antistatic conductive wires, and the sub-antistatic conductive wires are insulated from each other.

10. A display device, comprising:
an array substrate, comprising a substrate body, wherein the substrate body comprises a display region and a non-display region positioned around the display region; and
an antistatic conductive wire disposed in the non-display region;
wherein the antistatic conductive wire comprises at least two antistatic conductive layers configured to prevent static electricity;
wherein a surface of at least one antistatic conductive layer of the antistatic conductive wire is provided with a plurality of protrusions, the plurality of protrusions face other antistatic conductive layers of the antistatic conductive line, the plurality of protrusions are spaced at intervals on the surface of the antistatic conductive layer and are nanometer in size, and a height of the plurality of the protrusions is 100 nm to 400 nm.

11. The display device according to claim 10, wherein the antistatic conductive wire comprises a first antistatic conductive layer and a second antistatic conductive layer, the first antistatic conductive layer is disposed in a buffer insulating layer, and the second antistatic conductive layer is disposed in a protective insulating layer.

12. The display device according to claim 11, wherein the first antistatic conductive layer is a first doped germanium layer, and the first antistatic conductive layer and a second doped germanium layer disposed in the display region are disposed on a same layer.

13. The display device according to claim 11, wherein the first antistatic conductive layer is a metal layer, and the first antistatic conductive layer and a gate layer disposed in the display region are disposed on a same layer.

14. The display device according to claim 11, wherein the first antistatic conductive layer is a metal layer, and the first antistatic conductive layer and a source/drain layer disposed in the display region are disposed on a same layer.

15. The display device according to claim 10, wherein the at least two antistatic conductive layers overlap with projections on a surface of the substrate body along a predetermined direction.

16. The display device according to claim 10, wherein the at least two antistatic conductive layers are continuous and disposed around the display region.

17. The display device according to claim 10, further comprising at least one via hole defined between two adjacent antistatic conductive layers of the antistatic conductive line, wherein the two adjacent antistatic conductive layers are electrically connected to each other through a conductive material within the via hole.

18. The display device according to claim 10, wherein the antistatic conductive layers disposed on a same layer comprise a plurality of sub-antistatic conductive wires, and the sub-antistatic conductive wires are insulated from each other.

* * * * *